United States Patent [19]

Yamazaki et al.

[11] Patent Number: 5,138,190
[45] Date of Patent: Aug. 11, 1992

[54] CHARGE PUMP CIRCUIT

[75] Inventors: Akihiro Yamazaki, Sagamihara; Tomotaka Saito, Yokohama, both of Japan

[73] Assignee: Kabushiki Kaisha Toshiba, Kawasaki, Japan

[21] Appl. No.: 406,092

[22] Filed: Sep. 12, 1989

[30] Foreign Application Priority Data

Sep. 13, 1988 [JP] Japan ................. 63-229402

[51] Int. Cl.$^5$ .................. H03K 3/01; H03K 19/01
[52] U.S. Cl. .................. 307/296.5; 307/296.2; 307/264; 307/482; 365/189.11; 365/226
[58] Field of Search ........... 307/296.1, 296.2, 296.5, 307/264, 304, 482, 578; 365/226, 227, 189.11, 189.09; 363/60

[56] References Cited

U.S. PATENT DOCUMENTS

| | | | |
|---|---|---|---|
| 4,374,357 | 2/1983 | Olesin et al. | 307/304 |
| 4,631,421 | 12/1986 | Inoue et al. | 307/296.2 |
| 4,638,182 | 1/1987 | McAdams | 307/578 |
| 4,689,495 | 8/1987 | Liu | 307/264 |
| 4,916,334 | 4/1990 | Minagawa et al. | 307/296.5 |

OTHER PUBLICATIONS

Fink et al., *Electronics Engineers' Handbook*, McGraw-Hill Book Company, pp. 16–16, 1982.
J. F. Dickson, "On-Chip High-Voltage Generation in MNOS Integrated Circuits Using an Improved Voltage Multiplier Technique", IEEE Journal of Solid-State Circuits, vol. SC-11, No. 3, Jun. 1976, pp. 374–378.

Primary Examiner—Edward P. Westin
Assistant Examiner—Richard Roseen
Attorney, Agent, or Firm—Foley & Lardner

[57] ABSTRACT

A charge pump circuit including a step-up section (1) having an output point to which a load is connected, the step-up section (1) having a function to step up an output potential from a predetermined potential lower than a potential ($V_{PP}$) of a power supply to a desired potential higher than the power supply potential ($V_{PP}$), wherein the charge pump circuit comprises initial potential setting switch ($N_{10}$) connected between the power supply and the output point of the step-up section (1), and operative so that it is turned on with the beginning of the step-up operation of the step-up section (1) to propagate the power supply potential ($V_{PP}$) to the output point of the step-up section (1), and that it is turned off in a suitable time. With the beginning of the step-up operation of the step-up section (1), the initial potential setting switch ($N_{10}$) is turned on. As a result, a power supply potential ($V_{PP}$) is propagated to the output point of the step-up section (1). Thus, the output potential is initially set to a relatively high potential obtained by subtracting a voltage drop of the initial potential setting switch ($N_{10}$) from the power supply potential ($V_{PP}$). When the output of the step-up section (1) rises to some extent in a suitable time, the initial potential setting switch ($N_{10}$) is turned off. After that, the step-up section (1) delivers a voltage to the load.

5 Claims, 4 Drawing Sheets

CHARGE PUMP CIRCUIT

BACKGROUND OF THE INVENTION

This invention relates to a charge pump circuit, and more particularly to a charge pump circuit used for driving a semiconductor non-volatile memory having FAMOS (Floating gate avalanche injection MOS) transistors as respective cells.

In an EPROM or a flash EEPROM, etc., having FAMOS transistors as their cells, a high potential called a program potential, $V_{PP}$ is externally applied thereto in Order to effect a write operation, i.e., to inject electrons into the floating gate of the cell.

An equivalent circuit at the time of write operation of a typical EPROM is shown in FIG. 1. A program potential $V_{PP}$ is applied to the drain of a cell transistor $N_3$ through N-channel transistors $N_1$ and $N_2$ as shown. In this example, the transistors $N_1$ and $N_2$ are called a "write transistor" and a "select transistor", respectively.

When a high potential is applied to the drain D of the cell transistor $N_3$ and a program potential $V_{PP}$ is applied to the control gate CG as shown in FIG. 2, electrons are injected into the floating gate FG by the avalanche injection. Cells to which electrons have been injected undergo an increase in the threshold voltage $V_{TH}$. Writing into these cells is, thus, performed. On the other hand, cells to which no electrons are injected undergo no change in the threshold voltage $V_{TH}$. Thus, the programming of "0" and "1" is carried out in dependency upon difference of the threshold voltage.

Referring to FIG. 3, there is shown a rise characteristic of the threshold voltage $V_{TH}$ vs. the program voltage application time to the gate of each cell. This figure shows that, when a potential on the drain is taken as a parameter, the rise characteristic of the threshold voltage varies as indicated by the curves c, b and a in order recited according as the potential on the drain is increased. Accordingly, it is considered that the potential on the drain and the write time $T_{PW}$ (time until the threshold voltage reaches a predetermined threshold voltage $V_{THO}$) are correlative with each other. Namely, it is preferable that the potential on the drain is high if the write time $T_{PW}$ is desired to be shortened.

To realize this, the following measure is taken: Since the write operation is conducted through the N-channel transistors $N_1$ and $N_2$ as previously shown in FIG. 1, gate control potentials $V_{PG}$ of these transistors $N_1$ and $N_2$ as previously shown in FIG. 1, a gate control potential $V_{PG}$ for these transistors $N_1$ and $N_2$ is set to a value higher than the program potential $V_{PP}$, thus preventing voltage drops on these N-channel transistors $N_1$ and $N_2$. To obtain a high potential of the gate control potential $V_{PG}$, a charge pump circuit is used. Such a technology is disclosed in, e.g., J. PATHAK et al., "A 19-ns 250 mW CMOS Erasable Programmable Logic Device", IEEE JOURNAL OF SOLID-STATE CIRCUITS, VOL. SC-21, No. 5, OCTOBER, 1986.

A conventional circuit and its equivalent are shown in FIGS. 4 and 5, respectively. In this example, N-channel MOS transistors $N_6$ and $N_7$ equivalently serve as diodes as shown in FIG. 5, respectively. These transistors serve to block a reverse-current and hold a stepped-up voltage.

As seen from FIG. 4, an output potential (initial potential) $V_{OUT}(0)$ at the time of beginning of the step-up operation in this charge pump circuit is expressed as follows:

$$V_{OUT}(0) = V_{PP} - V_{THN4} - V_{THN6} - V_{THN7} \quad (1)$$

where $V_{THN4}$, $V_{THN6}$ and $V_{THN7}$ represent threshold voltages of the transistors $N_4$, $N_6$ and $N_7$, respectively. This output potential is considerably lower than the applied program potential $V_{PP}$. For example, when it is assumed that $V_{PP} = 12.5$ V and $V_{THN1} = V_{THN3} = V_{THN} = 2.5$ V, the output potential will become equal to a value expressed below:

$$V_{OUT}(0) = 12.5 - 2.5 \times 3 = 5 \text{ V}.$$

Further, an initial potential $V_B(0)$ on the point B will become equal to a value expressed below:

$$V_B(0) = V_{PP} - V_{THN4} - V_{THN6} \quad (2).$$

Thereafter, when a clock is delivered to a step-up capacitor C, a potential on the point B is stepped up by to a potential of the clock (e.g., a value corresponding to $V_{PP}$ where the clock is of the $V_{PP}$ system). As a result, this potential is passed through the transistor $N_7$ (subjected to a voltage drop corresponding to $V_{THN7}$) and appears on the output $V_{OUT}$. This results in no voltage drop in the transistor $N_5$. Thus the program potential appears on the point A as it is and a potential on the point B is expressed as follows $$V_B = V_{PP} = V_{THN6} \quad (3).$$

This potential is further stepped up by a potential of the clock (e.g., a value corresponding to $V_{PP}$) and is subjected to voltage drop corresponding to the threshold voltage $V_{THN7}$ of the transistor $N_7$, with the result that it appears on the output $V_{OUT}$. Accordingly, the output potential $V_{OUT}$ finally obtained is expressed at the maximum as follows:

$$V_{OUT} = V_{PP} - V_{THN6} + V_{CLOCK} - V_{THN7} \quad (4),$$

wherein $V_{CLOCK}$ is a potential of the clock (e.g. $V_{PP}$).

It is to be noted that a scheme is practically employed to further provide a transistor $N_8$ for limiter on the output point, thus limiting the output potential $V_{OUT}$ to about $V_{PP} + \alpha$ ($\alpha$ is a desired step-up value). In addition, a scheme is also employed to deliver an ordinary potential $V_{DD}$ for read operation through a D (depletion) type transistor $N_9$ at the time of nonprogramming, thus to stand by readout operation.

The problem with such a conventional charge pump circuit is that the initial value $V_{OUT}$ of the output potential is lower than the program potential $V_{PP}$ as given by the equation (1). Inconvenience due to this fact occurs mainly when the load of the step up circuit is large. Namely, since the step up efficiency is poor in the case of a large load, it will take much time for rising of the output as described above. For this reason, write time $T_{PW}$ may be rather prolonged.

SUMMARY OF THE INVENTION

An object of this invention is to provide a step up circuit such that an initial value of the output potential is relatively high, and that the rise characteristic is excellent, resulting in no possibility that write time is prolonged even in the case of a large load.

A charge pump circuit according to this invention includes a step-up section having an output point to which a load is connected, the step up section having a function to step up an output potential from a first predetermined potential lower than a potential of a power supply to a desired potential higher than the power supply potential, characterized in that the charge pump circuit includes an initial potential setting switch means connected between the power supply and the output point of the step-up section, and operative so that it is turned on with the beginning of the step-up operation of the step up section to transmit the power supply potential to the output point of the step up section, and operative so that it is turned on with the beginning of the stepping up operation of the step up section to propagate the power supply potential to the output point of the step up section, and is turned off in a suitable time.

In this step up circuit, the initial potential setting switching means is turned on with the beginning of the step-up operation, whereby the power supply potential is propagated to the output point of the step-up section. Thus, the output potential is initially set to a relatively high potential obtained by subtracting a voltage drop of the initial potential setting switch means from the power supply potential. By the time an output potential of the step-up section itself rises up to such a relatively high initial set potential, an output from the power supply is delivered to the load through the initial potential setting switch means. For this reason, a load applied to the step-up section is lessened. Thus, the step-up section can rapidly raise the output. When the output of the step-up section rises to some extent in a suitable time, the initial potential setting switch means is turned off. After that, the step up circuit delivers an output to the load. After the output of the step up section rises to a value close to the power supply potential by this turn-off operation, a reverse-current from the charge pump circuit to the power supply is blocked, thus preventing the step-up characteristic from being deteriorated. Accordingly, the step-up characteristic is drastically improved. In addition, since the number of elements added in order to obtain such a conspicuous effect is small, there is no possibility that such elements occupy a broad pattern area, giving hindrance to miniaturization.

DESCRIPTION OF THE PREFERRED EMBODIMENTS

Preferred embodiments according to this invention will now be described with reference to the attached drawings.

Figure 1:
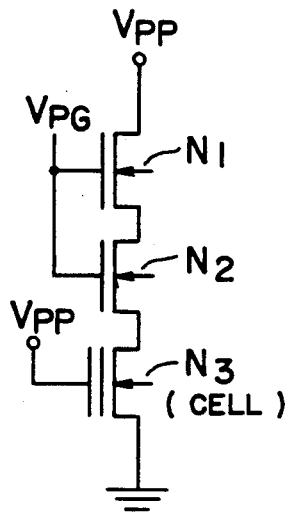
FIG. 1 is an equivalent circuit at the time of write operation of a typical EPROM.
Figure 2:
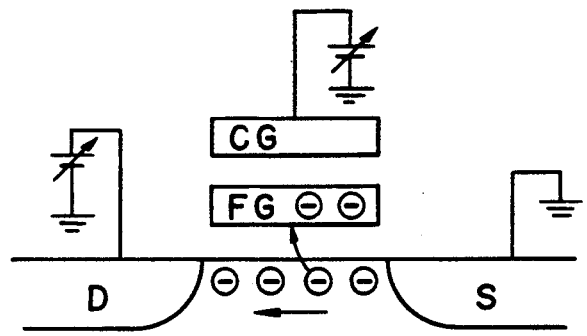
FIG. 2 is a view showing the writing principle of a typical EPROM cell.
Figure 3:
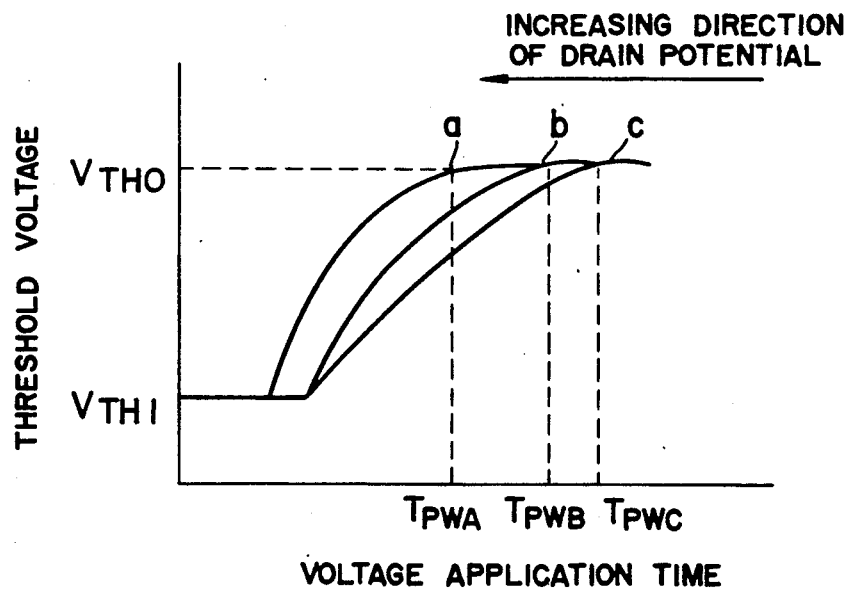
FIG. 3 is a write characteristic diagram of the typical EPROM cell.
Figure 4:
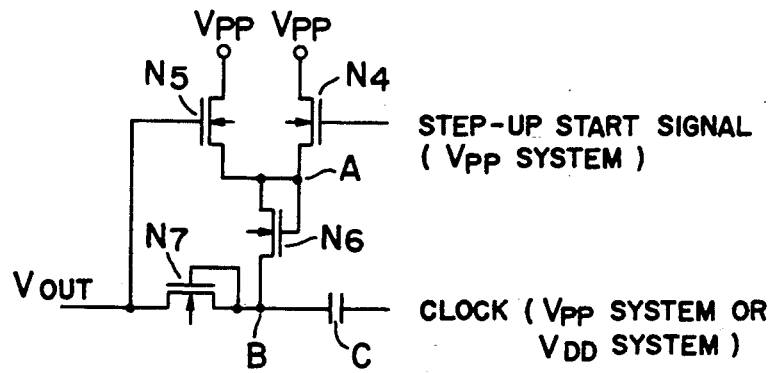
FIG. 4 is a circuit diagram showing an example of a conventional step up circuit.
Figure 5:
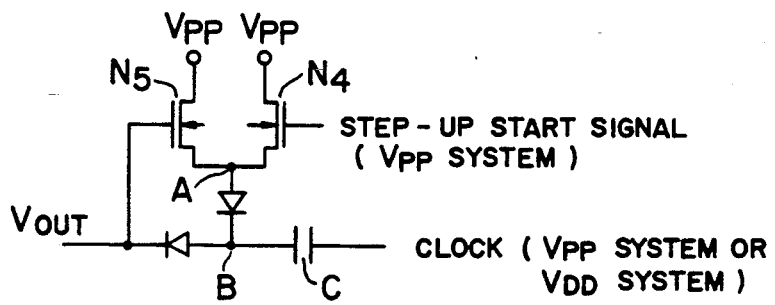
FIG. 5 is an equivalent circuit of FIG. 4.
Figure 6:
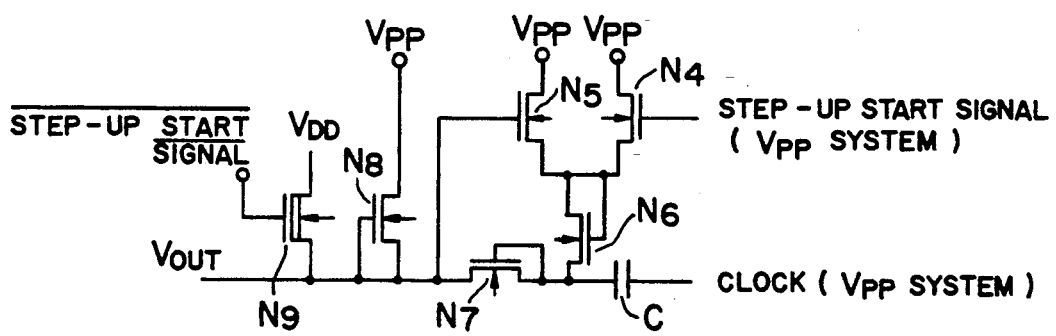
FIG. 6 is a circuit diagram showing the conventional circuit of FIG. 4 together with a circuit associated therewith.
Figure 7:
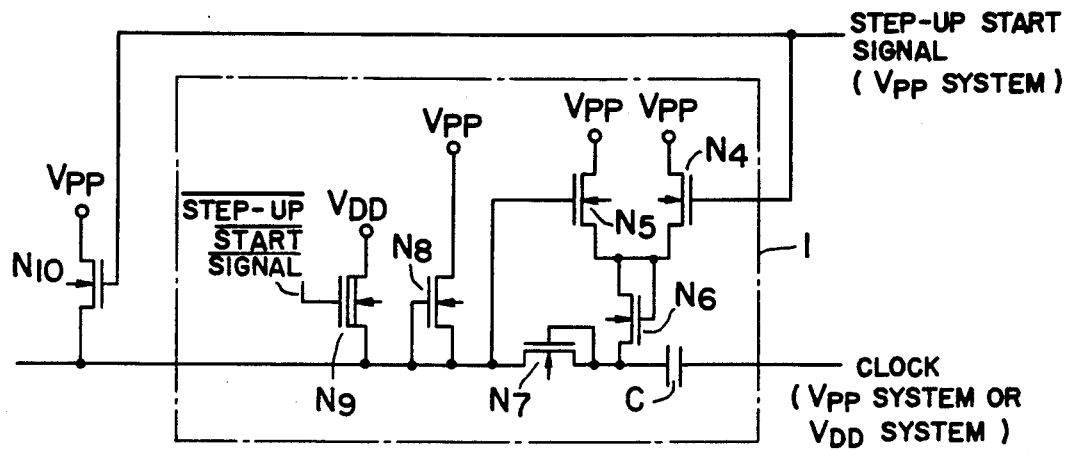
FIG. 7 is a circuit diagram showing an embodiment of this invention.

Initially referring to FIG. 7, there is shown an embodiment of a charge pump circuit according to this invention. The charge pump circuit of this embodiment includes a step-up section 1 of the same configuration as that of the conventional step-up section shown in FIG. 6, and an E (enhancement) type N-channel MOS transistor $N_{10}$ having a source and a drain connected to the output point of the step-up section 1 and a power source of the program potential $V_{PP}$ system, respectively. This transistor $N_{10}$ functions as follows. When an initial step-up start signal ($V_{PP}$ system) is delivered to its gate, the transistor $N_{10}$ is turned on, thus setting the output potential $V_{OUT}$ of the step-up section 1 to an initial potential.

The step-up section 1 includes an N-channel transistor $N_4$ as a step-up operation start switch, which is turned on in response to an input of the step-up start signal to the gate thereof to output, to the source side, a program potential $V_{PP}$ applied to the drain thereof; an N-channel transistor $N_6$ as a first diode having an anode connected to the source of the transistor $N_4$; a step-up capacitor C having one end connected to the cathode of the first diode $N_6$, thus to add a potential of a clock ($V_{PP}$ system or $V_{DD}$ system) applied to the other end thereof to a cathode potential of the first diode $N_6$; and an N-channel transistor $N_7$ as a second diode having an anode connected to the cathode of the first diode $N_6$, and a cathode serving as the output point of the step-up section 1.

In this embodiment, the first diode $N_6$ serves to prevent a current from reversely flowing from the stepped up cathode side to the anode side of a low potential, thus to hold a stepped up cathode potential. Further, the second diode $N_7$ serves to prevent a current from reversely flowing from the cathode side to the anode side when the clock falls, thus to hold a stepped up output potential $V_{OUT}$. The step-up section 1 further includes an N-channel transistor $N_5$ provided in parallel with the first switch $N_4$ and having a gate to which the output potential $V_{OUT}$ is delivered.

This transistor $N_5$ functions as follows. When an output potential $V_{OUT}$ stepped up so that it is higher than the program potential $V_{PP}$ is applied to its gate, the transistor $N_5$ outputs the program potential $V_{PP}$ on the drain side to the source side as it is without a voltage drop to allow the first switch $N_4$ to undergo no voltage drop, thus to provide a further improved step-up characteristic of the step-up section 1. Moreover, the step-up section 1 further comprises an N-channel transistor $N_8$ as a limiter to limit a stepped up output potential $V_{OUT}$ to a desired potential $V_{PP}+\alpha$ to finally output the limited potential. It is to be noted that whether or not the transistors $N_5$ and/or $N_8$ are provided, and whether a clock of the $V_{PP}$ system is used or a clock of the $V_{DD}$ system is used are determined to what degree the step-up value $\alpha$ of a final output potential $V_{PP}+\alpha$ is set. In addition, the step-up section 1 further comprises a D type N-channel transistor $N_9$ for delivering a drain potential $V_D$ for readout. This transistor $N_9$ is turned on at the time of non-programming in response to an inverted signal of the step-up signal applied to its gate.

Figure 8:
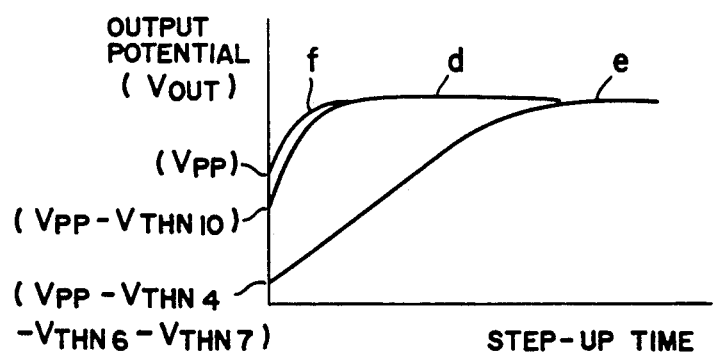
FIG. 8 is a view showing the step up characteristic of the embodiment according to this invention in comparison with that of the conventional example.

In the configuration stated above, when an input of a step-up start signal is provided, the initial potential setting transistor $N_{10}$ is turned on. As a result, the output potential $V_{OUT}$ is immediately set to an initial potential $V_{OUT}(0)$ expressed as follows:

$$V_{OUT}(0) = V_{PP} - V_{THN10} \qquad (5),$$

where $V_{THN10}$ is a threshold potential of the transistor $N_{10}$. For this reason, as indicated by the curve d in FIG. 8, the output potential $V_{OUT}$ can rise from the potential $V_{PP} - V_{THN10}$. This rising process is substantially the same as that of the conventional circuit which has been previously described. However, rising is started from the initial potential $V_{PP} - V_{THN4} - V_{THN6} - V_{THN7}$ as previously explained in the case of the rising characteristic of the conventional circuit indicated by the curve e. On the contrary, the circuit of this embodiment can start rising from an initial potential which is high by a multiple of threshold value $V_{TH}$ corresponding to two stages of the transistors as compared to the conventional circuit. For example, when it is assumed that the program voltage $V_{PP}$ is equal to 12.5 volts and the threshold voltage $V_{TH}$ of each transistor is nearly equal to 2.5 volts in the same manner as in the case of the study on the prior art, an initial potential $V_{OUT}(0)$ according to this embodiment is expressed as follows:

$$V_{OUT}(0) = 12.5 \text{ V} - 2.5 \text{ V} = 10 \text{ V}.$$

It is seen from this that a considerably higher initial potential can be provided as compared to $V_{OUT}(0) = 5$ V of the prior art.

Further, since the step-up section 1 must drive a load of the output from the beginning, as described above in the prior art, the step-up efficiency is poor, so the rise characteristic is gentle as indicated by the curve e. On the contrary, in the case of this embodiment, since the load is driven by the initial potential setting transistor $N_{10}$ for a time period during which the transistor $N_{10}$ is turned on, the step-up section 1 has no need to drive a load. Accordingly, the step-up efficiency is good and the rising is sharp or steep.

It is seen from the above that this embodiment can step up the output potential $V_{OUT}$ to a desired potential in an extremely short time as compared to that of the prior art.

It is to be noted that since when the output potential $V_{OUT}$ is raised to the initial potential $V_{PP} - V_{THN10}$ in this embodiment, the gate-source voltage of the initial potential setting transistor $N_{10}$ is lowered to reach the threshold voltage $VTHN_{10}$, it is automatically turned off, and, after that, an output potential is delivered by the step-up section 1, thus to perform a step-up operation. This turn off operation prevents that a current inversely flows from the output point stepped up above the power supply voltage $V_{PP}$ to the power source through the transistor $N_{10}$, so that an excessive load is applied to the step-up section 1, resulting in a deteriorated step-up characteristic.

Figure 9:
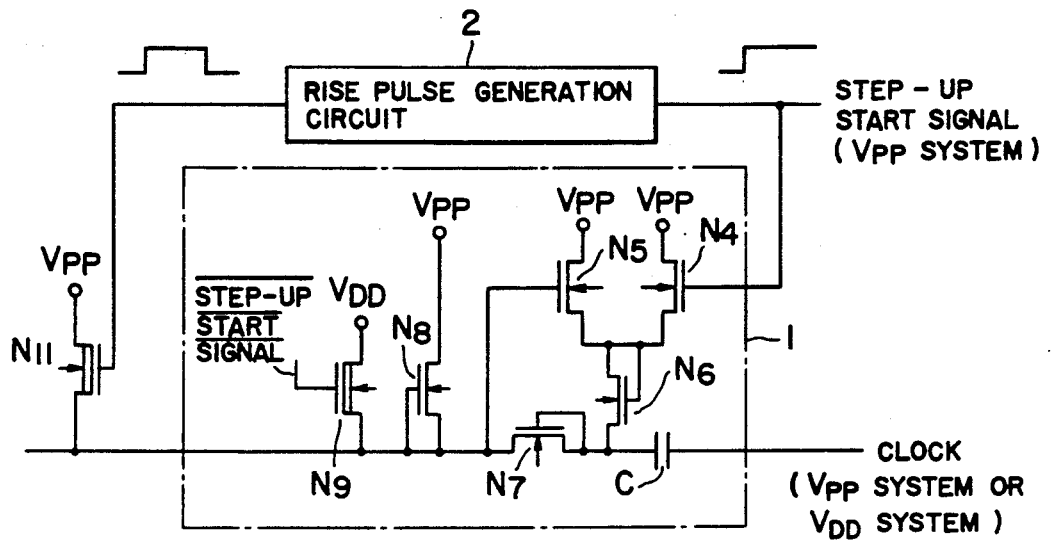
FIG. 9 is a circuit diagram showing another embodiment according to this invention.

Turning now to FIG. 9, there is shown another embodiment of this invention. This embodiment differs from the embodiment shown in FIG. 7 in that a D type N-channel transistor $N_{11}$ is used as the initial potential setting transistor, thus to apply, to the gate thereof, an output pulse ($V_{PP}$ system) from a rise pulse generation circuit 2 for generating a pulse having a fixed time width in response to the rise of the step-up start signal.

The merit of this embodiment is that the initial value $V_{OUT}(0)$ of an output potential can be set to a value higher than that in the embodiment shown in FIG. 7. Namely, since D type transistor is used as the initial potential setting transistor $N_{11}$, there is no voltage drop on the transistor $N_{11}$. Accordingly, a power supply potential $V_{PP}$ on the drain side is propagated to the output point on the source side, and then appears as the initial potential $V_{OUT}(0)$. Thus, sharper rise characteristic of the output potential $V_{OUT}$ can be provided, as indicated by the curve f.

In this case, even when the output potential $V_{OUT}$ reaches the power supply potential $V_{PP}$, the transistor $N_{11}$ is not automatically turned off because it is a D type. In view of this, an approach is employed to limit the pulse width of the rise pulse generation circuit 2 to a fixed value, thus to forcedly turn the transistor $N_{11}$ off when the output potential $V_{OUT}$ has reached the power supply potential $V_{PP}$.

In the embodiment shown in FIG. 9, when the potential $V_{PP}$ becomes equal to zero volts at the time of non step-up operation i.e., in the state where the output potential $V_{OUT}$ is equal to the potential $V_{DD}$, since the transistor $N_{11}$ is not turned off as described above, an inconvenience might occur such that a direct current flows out from the potential $V_{DD}$ side through the transistor $N_{11}$.

Figure 10:
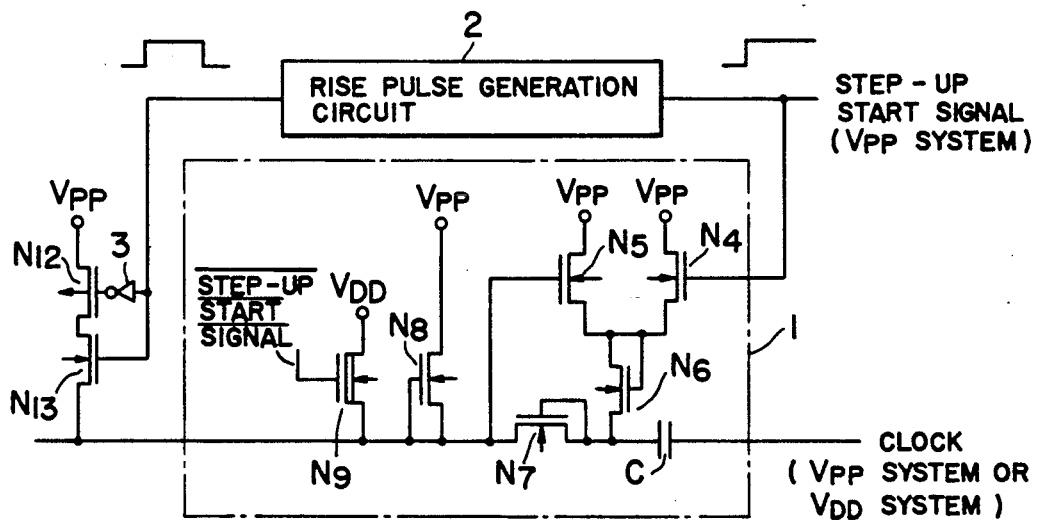
FIG. 10 is a circuit diagram showing a further embodiment according to this invention.

An embodiment improved to prevent this is shown in FIG. 10. In this embodiment, a series circuit consisting of an E type P-channel transistor $N_{12}$ and an E type N-channel transistor $N_{13}$ is used in place of the transistor $N_{11}$ of FIG. 9. It is to be noted that while the transistor $N_{13}$ is of the E type, its threshold voltage is substantially equal to zero volts (i.e., zero volts, or a value close to zero volts). Further, since these two transistors $N_{12}$ and $N_{13}$ are turned on only for a predetermined time period from the beginning of the step-up operation, an output signal from the rise pulse generation circuit 2 is applied to the gate of the N-channel type transistor $N_{13}$, and such an output signal is also inverted through an inverter 3 and is then applied to the gate of the P-channel transistor $N_{12}$.

In this embodiment, since the transistors $N_{12}$ and $N_{13}$ are in an off state even when the potential $V_{PP}$ becomes equal to zero volts at the time of non step-up operation, no direct current path is formed. On the other hand, since voltage drops on those transistors $N_{12}$ and $N_{13}$ at the time of step-up operation are substantially equal to zero volts, an initial potential $V_{OUT}(0)$ nearly equal to the potential $V_{PP}$ is provided.

What is claimed is:

1. A charge pump circuit including a step-up section having an output point to which a load is connected, said step-up section being responsive to a step-up start signal to start a step-up operation in which a potential of said output point is stepped up from a predetermined potential lower than a potential of a power supply to a desired potential higher than said power supply potential, said charge pump circuit comprising:

an initial potential setting switch means connected between said power supply and said output point of said step-up section, and responsive to the step-up start signal to be turned on at the beginning of the step-up operation of said step up section to propagate said power supply potential to said output point of said step-up section, and to be turned off at a suitable time.

2. A charge pump circuit as set forth in claim 1, wherein said step-up section includes step-up start switch means operative in response to the step-up start signal and having one end connected to said power supply, first diode means having an anode connected to the the end of said switch means, a step-up capacitor having one end connected to the cathode of said first diode means, thus to add a potential applied to the other end thereof to a potential on the cathode of said first diode means, and second diode means having an anode connected to the cathode of said first diode means and a cathode serving as said output point of said step-up section.

3. A charge pump circuit as set forth in claim 1, wherein said initial potential setting switch means comprises an enhancement type N-channel MOS transistor having a source and a drain connected to said power supply and said output point, respectively, said enhancement type N-channel MOS transistor being controlled by the set-up start signal to be turned on at the beginning of the step-up operation.

4. A charge pump circuit as set forth in claim 1, wherein said initial potential setting switch means comprises a depletion type N-channel MOS transistor having a source and a drain connected to said power supply and said output point, respectively, said depletion type N-channel MOS transistor being controlled by the step-up start signal to be in an ON state only for a predetermined time period from the beginning of the step-up operation in said step-up section.

5. A charge pump circuit including a step-up section having an output point to which a load is connected, said step-up section being responsive to a step-up start signal to step up a potential of said output point from a predetermined potential lower than a potential of a power supply to a desired potential higher than said power supply potential, said charge pump circuit comprising:
initial potential setting switch means connected between said power supply and said output point of said step-up section, and responsive to the step-up start signal to be turned on at the beginning of the step-up operation of said step up section to propagate said power supply potential to said output point of said step-up section, and to turned off at a suitable time;
wherein said initial potential setting switch means is comprised of a series circuit consisting of an enhancement type P-channel MOS transistors and an enhancement type N-channel MOS transistor, said N-channel MOS transistor having a threshold voltage substantially equal to zero volts, a control signal being applied to respective gates of said two transistors so that they are in an ON state only for a predetermined time period from the beginning of the step-up operation in said step-up section.

* * * * *